US012534806B2

(12) United States Patent
Kimtee

(10) Patent No.: US 12,534,806 B2
(45) Date of Patent: Jan. 27, 2026

(54) FLUSH FIXTURE FOR SHOWERHEAD

(71) Applicant: ASM IP HOLDING B.V., Almere (NL)

(72) Inventor: Ankit Kimtee, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 899 days.

(21) Appl. No.: 17/212,821

(22) Filed: Mar. 25, 2021

(65) Prior Publication Data

US 2021/0310123 A1 Oct. 7, 2021

Related U.S. Application Data

(60) Provisional application No. 63/006,253, filed on Apr. 7, 2020.

(51) Int. Cl.
*H01L 21/67* (2006.01)
*C23C 16/44* (2006.01)
*C23C 16/455* (2006.01)

(52) U.S. Cl.
CPC .... *C23C 16/45565* (2013.01); *C23C 16/4401* (2013.01); *H01L 21/67023* (2013.01)

(58) Field of Classification Search
CPC .......... C23C 16/4401; C23C 16/45565; H01L 21/67023
USPC .......... 239/584
See application file for complete search history.

(56) References Cited

U.S. PATENT DOCUMENTS

| | | | | | |
|---|---|---|---|---|---|
| 2,410,420 | A * | 11/1946 | Bennett | A47L 13/08 242/405 |
| 2,563,931 | A * | 8/1951 | Harrison | G01K 7/04 73/866.2 |
| 2,660,061 | A * | 11/1953 | Lewis | G01K 7/04 374/140 |
| 2,745,640 | A * | 5/1956 | Cushman | D01D 1/06 165/47 |
| 2,990,045 | A * | 6/1961 | Root | F16D 43/25 236/35 |
| 3,038,951 | A * | 6/1962 | Mead | G01K 7/025 374/E7.006 |
| 3,089,507 | A * | 5/1963 | Drake et al. | F16K 35/06 251/68 |
| 8,328,939 | B2 * | 12/2012 | Choi | C23C 16/455 156/345.43 |
| 2002/0027081 | A1 * | 3/2002 | Nagai | C25D 5/10 205/183 |
| 2004/0140199 | A1 * | 7/2004 | Mizohata | C25D 17/001 257/E21.175 |
| 2016/0024656 | A1 * | 1/2016 | White | C23C 16/45565 239/548 |

* cited by examiner

*Primary Examiner* — Chee-Chong Lee
(74) *Attorney, Agent, or Firm* — Snell & Wilmer L.L.P.

(57) ABSTRACT

The present disclosure pertains to embodiments of a flush fixture for flushing a showerhead assembly. The flush fixture includes two distinct cavities, an inner cavity and an outer cavity surrounding the inner cavity and not fluidly connected to the inner cavity. When the flush fixture is mounted to a showerhead, inner apertures are in fluid connection with the inner cavity and one or more exhaust holes are in fluid connection with the outer cavity. Separately accessing the inner apertures and the one or more exhaust holes allows the showerhead to be properly flushed.

21 Claims, 6 Drawing Sheets

FLUSH FIXTURE FOR SHOWERHEAD

CROSS-REFERENCE TO RELATED APPLICATIONS

This application claims priority to U.S. Provisional Patent Application No. 63/006,253, filed Apr. 7, 2020, the entire contents of which are hereby incorporated by reference in their entirety and for all purposes.

BACKGROUND

Field

The present disclosure generally relates to a flush fixture for flushing a showerhead plate that can be used in a vapor distribution system.

Description of the Related Art

Vapor-phase reactors, such as chemical vapor deposition (CVD), plasma-enhanced CVD (PECVD), atomic layer deposition (ALD), and the like can be used for a variety of applications, including depositing and etching materials on a substrate surface. For example, vapor-phase reactors can be used to deposit and/or etch layers on a substrate to form semiconductor devices, flat panel display devices, photovoltaic devices, microelectromechanical systems (MEMS), and the like.

A typical vapor-phase reactor system includes a reactor including a reaction chamber, one or more precursor vapor sources fluidly coupled to the reaction chamber, one or more carrier or purge gas sources fluidly coupled to the reaction chamber, a vapor distribution system to deliver gases (e.g., the precursor vapor(s) and/or carrier or purge gas(es)) to a surface of a substrate, and an exhaust source fluidly coupled to the reaction chamber. The system also typically includes a susceptor to hold a substrate in place during processing. The susceptor can be configured to move up and down to receive a substrate and/or can rotate during substrate processing.

The vapor distribution system may include a showerhead assembly for distributing vapor(s) to a surface of the substrate. The showerhead assembly is typically located above the substrate. During substrate processing, vapor(s) flow from the showerhead assembly in a downward direction toward the substrate and then radially outward over the substrate.

SUMMARY

In one aspect a flush fixture for flushing component(s) of a showerhead assembly of a semiconductor processing device is provided including: a fixture body configured to be mounted to component(s) of the showerhead assembly, the fixture body having an upper surface and a lower surface opposite the upper surface. The fixture body includes: an inner cavity exposed at the lower surface of the fixture body; an outer cavity exposed at the lower surface of the fixture body and separated from the inner cavity by a partition; one or more inner channels in fluid communication with the inner cavity, the one or more inner channels extending from the inner cavity to the upper surface; and one or more outer channels in fluid communication with the outer cavity, the one or more outer channels extending from the outer cavity to the upper surface.

The outer cavity includes an annular cavity which at least partially surrounds the inner cavity. The fixture body may include a polymer material. In another aspect, a system for flushing a showerhead assembly is provided including: the flush fixture described above; and a showerhead plate comprising inner apertures and one or more exhaust holes, where the flush fixture is configured to be mounted to the showerhead such that the inner apertures are in fluid communication with the inner cavity and the one or more exhaust holes are in fluid communication with the outer cavity. The showerhead may include a metal or a metal alloy.

In some implementations, the one or more inner channels are fluidly connected to inner delivery piping which is configured to deliver flushing fluid into the one or more inner channels. The one or more outer channels may be fluidly connected to outer delivery piping which is configured to deliver flushing fluid into the one or more outer channels. The inner delivery piping and the outer delivery piping may be both connected to the same flushing fluid source, the inner delivery piping and the outer delivery piping configured to independently deliver the flushing fluid into the respective one or more inner channels and one or more outer channels. The inner delivery piping and the outer delivery piping may be connected to separate flushing fluid sources. The system may further include an inner gasket positioned between the showerhead and the flush fixture, the inner gasket horizontally surrounding the inner cavity in order to prevent flushing fluid delivered into the inner cavity from entering the outer cavity and the one or more exhaust holes and in order to prevent flushing fluid delivered into the outer cavity from entering the inner cavity and the inner apertures. The system may further include an outer gasket positioned between the showerhead plate and the flush fixture, the outer gasket horizontally surrounding the outer cavity in order to direct the flushing fluid delivered into the outer cavity into the one or more exhaust holes.

The one or more exhaust holes are positioned to surround the inner apertures. The one or more exhaust holes may be located radially outwards from the inner aperture holes with respect to the center of the flush fixture. At least exhaust hole may be larger in diameter than at least one of the inner apertures. The one or more exhaust holes and the inner apertures all may include a cylindrical middle portion and the diameter of the cylindrical middle portion of each exhaust hole may be larger than the cylindrical middle portion of each inner aperture. The flush fixture may be mounted to the showerhead plate by a connector.

The system may further include a reservoir. The reservoir may include a drain; a sensor; and a probe connected to the sensor, where the flush fixture and the showerhead plate are configured to be mounted on the reservoir such that when flushing fluid is flushed through the showerhead plate, the fluid drains into the reservoir and an electrical property is sensed by the sensor through the probe.

In another aspect, a flush fixture for flushing a showerhead plate of a semiconductor processing device is provided including: a fixture body configured to be mounted to the showerhead plate, the fixture body having an upper surface and a lower surface opposite the upper surface. The fixture body includes: an inner cavity exposed at the lower surface of the fixture body; and an outer cavity exposed at the lower surface of the fixture body and separated from the inner cavity by a partition, the outer cavity comprising an annular cavity that extends around the inner cavity. The flush fixture may further include: one or more inner channels in fluid communication with the inner cavity, the one or more inner channels extending from the inner cavity to the upper surface; and one or more outer channels in fluid communication with the outer cavity, the one or more outer channels extending from the outer cavity to the upper surface.

In another aspect, a method of flushing component(s) of a showerhead assembly is provided including: mounting a flush fixture to a showerhead plate such that an inner cavity of the flush fixture is in fluid communication with a plurality of inner apertures of the showerhead plate and such that an outer cavity of the flush fixture is in fluid communication with one or more exhaust holes of the showerhead plate; delivering one or more flushing fluids through the inner cavity and the inner apertures; and delivering the one or more flushing fluids through the outer cavity and the one or more exhaust holes. The method may further include: positioning the flush fixture and showerhead over a reservoir, wherein the reservoir includes a resistivity sensor; and measuring the resistivity of the flushing fluid captured within the reservoir with the resistivity sensor, where running flushing fluid through the flush fixture and the showerhead plate occurs until the measured resistivity stabilizes. The one or more flushing fluids can be independently delivered through the inner cavity and the outer cavity

DETAILED DESCRIPTION

Figure 1:
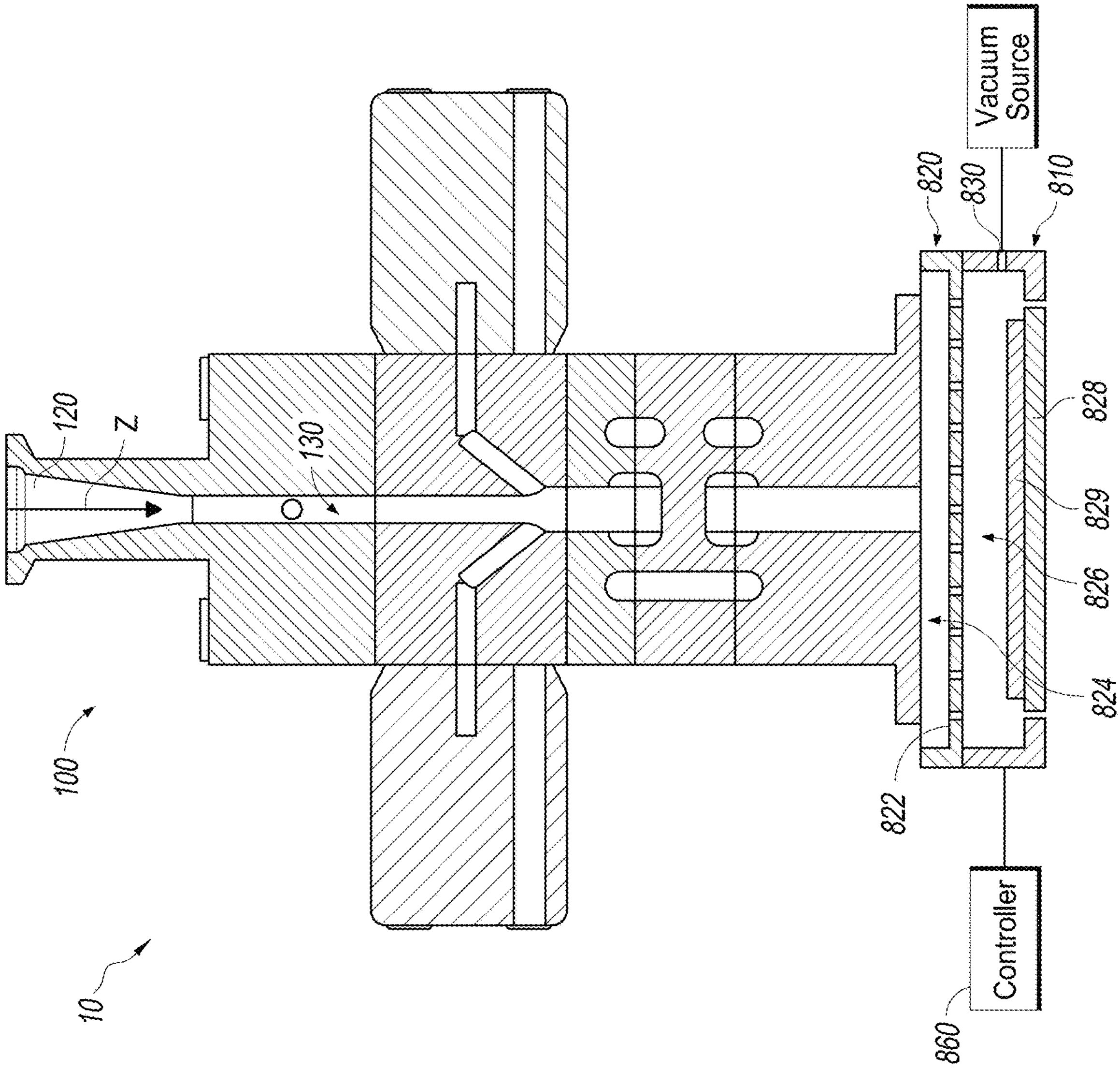
FIG. 1 is a schematic side sectional view illustrating an example vapor distribution system.

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

In some semiconductor processing devices, after fabricating, repairing, or servicing a showerhead plate of a showerhead assembly of a vapor distribution system, there may be debris or particles that remain within the apertures and/or the exhaust holes of the showerhead. These debris or particles can be transferred from the showerhead plate to the wafer during processing and leave particles on wafers causing unwanted defects. These debris or particles can also negatively affect vapor distribution in many ways such as blockage of inner supply apertures which may lead to uneven vapor distribution. It is noted that inner supply apertures within the showerhead are typically remarkably small and thus even small pieces of debris or particles can greatly affect vapor distribution within the system. Debris or particles may also contaminate larger outer exhaust apertures of the showerhead plate, which may also reduce the performance of deposition processes.

The vapor distribution systems which include showerhead assemblies can be used to process substrates, such as semiconductor wafers, in vapor-phase reactors. Example vapor-phase reactors include chemical vapor deposition (CVD) reactors, plasma-enhanced CVD (PECVD) reactors, low-pressure CVD (LPCVD) reactors, and atomic layer deposition (ALD) reactors. By way of example, the showerhead assemblies may be used in showerhead-type vapor-phase reactor systems, in which vapors generally flow in a downward direction from a showerhead and toward a substrate.

It is advantageous to have a system that cleans the showerhead after fabrication in order to flush out debris and particles that may remain due to reasons mentioned above. A typical showerhead assembly includes a showerhead with one or more showerhead plenums adjacent to one surface of the showerhead and a plurality of inner apertures spanning between the plenum(s) and a distribution surface (substrate or process chamber side) of the showerhead. A typical showerhead may also include exhaust holes on the outside of the inner apertures used to allow exhaust vapor(s) to escape from the inside of the plenum(s). The exhaust holes are typically larger in diameter than each of the inner apertures. The debris and particles within inner apertures and outer exhaust holes of the showerhead can be harmful to deposition and thus it can be beneficial to thoroughly and efficiently flush out the debris and particles from the inner apertures and the outer exhaust holes. The inner apertures are typically much smaller than the exhaust holes. Due at least in part to the size difference between the inner apertures and the exhaust holes, a flush fixture that connects to the showerhead plate with a single common cavity in fluid communication with both the inner apertures and the exhaust holes does not properly flush the showerhead plate. The exhaust holes create a pressure differential which draws liquid away from the inner apertures because the exhaust holes are larger than the inner apertures. Thus, a greater amount of the flushing liquid goes through the exhaust holes while the inner apertures draw less of the flushing fluid, which leads to uneven flushing. Accordingly, in various embodiments disclosed herein, a system with an outer cavity fluidly connected to exhaust holes and an inner cavity separately in fluid connection with the inner apertures can advantageously provide even, thorough, and efficient cleaning of the showerhead plate during manufacturing or maintenance. Such a system allows for separate flushing fluid to be provided to the inner apertures and the exhaust holes and thus alleviates the issue of having a pressure differential due to the unequal size of the inner apertures and the exhaust holes.

FIG. 1 illustrates an example vapor distribution system which uses a showerhead assembly. FIG. 1 illustrates a semiconductor processing device 10, which is also shown in and described in connection with FIG. 8B of U.S. Patent Publication No. US 2017-0350011, the entire contents of which are incorporated by reference herein in their entirety and for all purposes. A manifold 100 is part of the overall semiconductor processing device 10. The manifold 100 can include a bore 130 that injects vapor downwards towards a dispersion device comprising a showerhead assembly 820. It is understood that the manifold 100 can include multiple blocks connected together, as illustrated, or can comprise one unitary body. The manifold 100 can be connected upstream of a reaction chamber 810. In particular, an outlet of the bore 130 can communicate with a reactant injector, particularly the dispersion mechanism in the form of the showerhead assembly 820. The showerhead assembly 820 includes a showerhead plate 822 that defines a showerhead plenum 824 or chamber above the plate 822. The showerhead assembly 820 communicates vapors from the manifold 100 to a reaction space 826 below the showerhead plate 822. The reaction chamber 810 includes a substrate support 828 configured to support a substrate 829 (e.g., a semiconductor wafer) in the reaction space 826. The reaction chamber also includes an exhaust opening 830 connected to a vacuum source. While shown with a single-wafer, showerhead type of reaction chamber, the skilled artisan will appreciate that the manifold can also be connected to other types of reaction chambers with other types of injectors, e.g., batch or furnace type, horizontal or cross-flow reactor, cluster reactors, etc. Also note that the illustrated showerhead assembly 820 is a relatively simple one with a single plenum, whereas the apparatuses, methods and advantages therefore are applicable to more complicated assemblies, such as those defining separate plenums and separate sets of showerhead apertures for communicating with separate reactants.

Any suitable number or type of reactants can be supplied to the reaction chamber 810. Various embodiments disclosed herein can be configured to deposit a metal oxide layer(s) onto the substrate. In some embodiments, one or more of the reactant sources can contain a naturally gaseous ALD reactant, such as nitrogen and oxygen precursors such as $H_2$, $NH_3$, $N_2$, $O_2$, or $O_3$. Additionally or alternatively, one or more of the reactant sources can include a vaporizer for vaporizing a reactant which is solid or liquid at room temperature and atmospheric pressure. The vaporizer(s) can be, e.g., liquid bubblers or solid sublimation vessels. Examples of solid or liquid reactants that can be held and vaporized in a vaporizer include various HfO and TiN reactants. For example, solid or liquid reactants that can be held and vaporized can include, without limitation, vaporized metal or semiconductor precursors, such as liquid organometallic precursors such as trimethylaluminum (TMA), TEMAHf, or TEMAZr; liquid semiconductor precursors, such as dichlorosilane (DCS), trichlorosilane (TCS), trisilane, organic silanes, or $TiCl_4$; and powdered precursors, such as $ZrCl_4$ or $HfCl_4$. The skilled artisan will appreciate that embodiments can include any desired combination and arrangement of naturally gaseous, solid or liquid reactant sources.

The semiconductor processing device 10 can also include at least one controller 860, including processor(s) and memory with programming for controlling various components of the device 10. While shown schematically as connected to the reaction chamber 810, the skilled artisan will appreciate that the controller 860 communicates with various components of the reactor, such as vapor control valves, heating systems, gate valves, robot wafer carriers, etc., to carry out deposition processes. In operation, the controller 860 can arrange for a substrate 829 (such as a semiconductor wafer) to be loaded onto the substrate support 828, and for the reaction chamber 810 to be closed, purged and typically pumped down in readiness for deposition processes, particularly atomic layer deposition (ALD). The controller 829 can further be configured to control the sequence of deposition. For example, the controller 829 can send control instructions to reactant valve(s) to cause the reactant valve(s) to open and supply reactant vapor to the manifold 100. The controller 829 can also send control instructions to inactive gas valve(s) to cause the inactive gas valve(s) to open and supply inactive purge gas to the manifold 100. The controller 829 can be configured to control other aspects of the processes as well.

The manifold 100 can inject multiple reactants such as a first reactant vapor and a second reactant vapor, either simultaneously to induce mixing or sequentially to cycle between reactants. During some processes, a purge gas can injected from the bore 130 to the showerhead assembly 820 in order to purge the first reactant vapor so that the first reactant does not contaminate or mix with the subsequently-injected second reactant vapor. Similarly, after the deposition of the second reactant vapor and before deposition of another reactant (e.g., the first reactant vapor or a different reactant vapor), an additional purge step takes place in which inactive gas is delivered downwardly through an inlet 120 to the showerhead assembly 820 and reaction chamber 826. Although the embodiments disclosed herein are described in connection with the device 10 and showerhead assembly 820 of FIG. 1, it should be appreciated that the embodiments of the flush fixture described herein can be used with showerhead plate for any suitable showerhead assembly, which can be installed in any suitable type of semiconductor processing device or system.

Figure 2A:
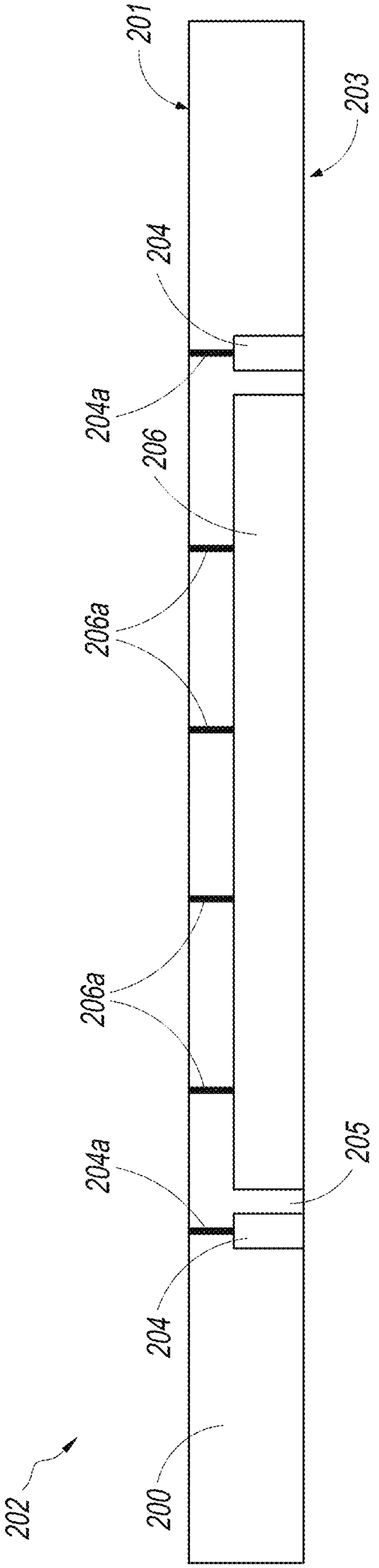
FIG. 2*a* is a schematic cross sectional view of an embodiment of a flush fixture.
Figure 2B:
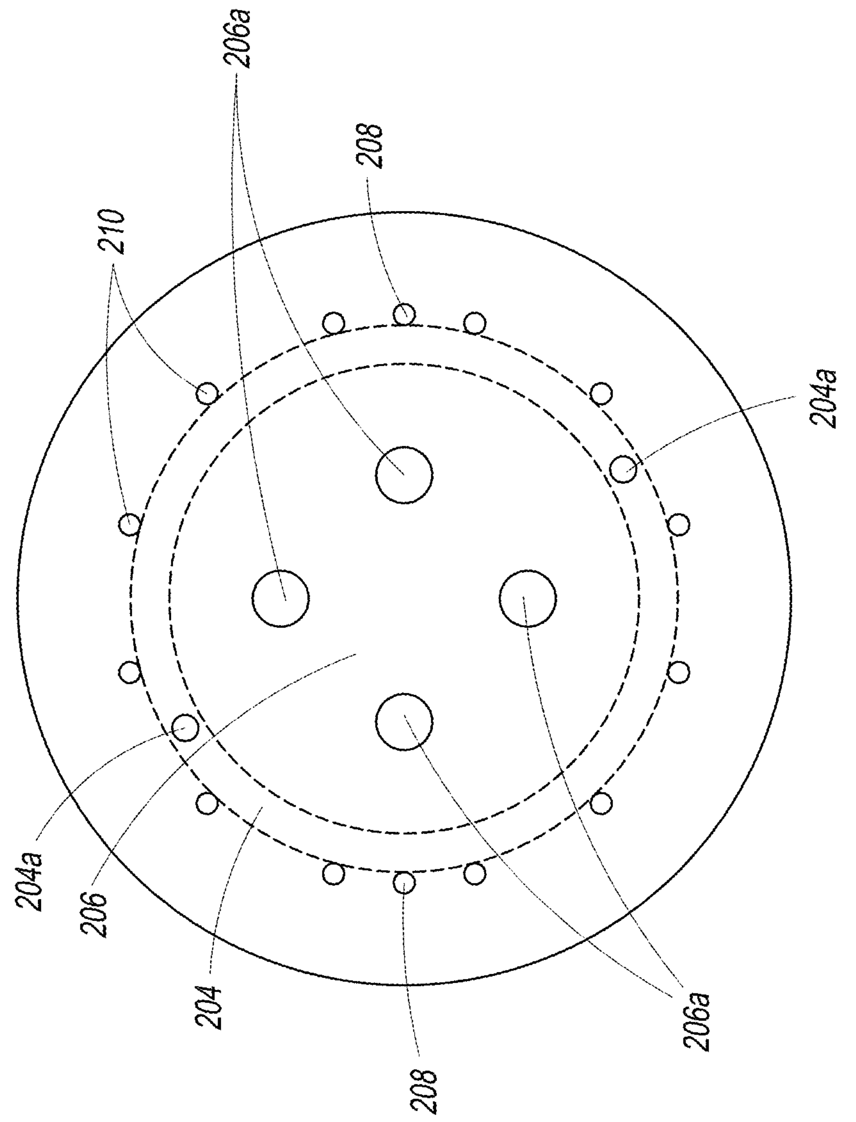
FIG. 2*b* is a schematic top down view of an embodiment of a flush fixture.

FIG. 2*a* illustrates a cross sectional view of an embodiment of a flush fixture 202 for flushing a showerhead plate or assembly such as, for example, the showerhead plate 822 or assembly 820 of FIG. 1. The flush fixture 202 includes a fixture body 200 (which can comprise, e.g., a cylindrical bulk material) with an inner cavity 206 and an outer cavity 204. The fixture body 200 can have an upper surface 201 and a lower surface 203 opposite the upper surface 201. The inner cavity 206 and the outer cavity 204 can be distinct cavities that are not fluidly connected. For example, as shown in FIG. 2A, the inner cavity 206 can be separated from the outer cavity 204 by a partition 205. The partition 205 can comprise a portion of the fixture body 200, for example, a projection that extends downwardly from the fixture body between the cavities 206, 204. Further, the inner and outer cavities 206, 204 can be exposed at (or can open to) the lower surface 203 of the fixture body 200. In the embodiment of FIGS. 2*a*-2*b*, the outer cavity 204 can at least partially surround the inner cavity 204. For example, the outer cavity 204 can comprise an annular-shaped cavity that surrounds (e.g., completely surrounds) the inner cavity 204. In other embodiments, the outer cavity 204 may only partially surround the inner cavity 206. As shown in a side cross-section (see FIG. 2*a*), a lateral width of the inner cavity 206 may be wider than a lateral width of the outer cavity 204.

One or more inner channels 206*a* can be in fluid connection with the inner cavity 206. As shown, the inner channels 206*a* can extend upwardly from the inner cavity 206 to the upper surface 201 of the fixture body 200. While four inner channels are illustrated in FIG. 2*b*, there may more or less than four inner channels. There may be any suitable number of inner channels. As shown in FIG. 2*a*, the respective widths or diameters of the inner channels 206*a* may be smaller than the inner cavity 206. As explained herein, the inner channel(s) 206*a* can be sized and arranged to deliver a flushing fluid to the inner cavity 206. The major lateral dimension (e.g., width or diameter) of each of the inner channels may be about 1.5 inches. In some embodiments, the inner channels may have a major lateral dimension that is more or less than 1.5 inches in diameter depending on, for example, the size of the showerhead plate that is to be flushed.

One or more outer channels 204*a* may be connected to the outer cavity 204. For example, as shown, the one or more outer channels 204*a* can extend upwardly from the outer cavity 204 to the upper surface 201 of the fixture body 200. While two outer channels are illustrated in FIG. 2*b*, there may be more than two outer channels. There may also be only one outer channel connected to the outer cavity 204. The major lateral dimension (e.g., width or diameter) of each of the inner channels may be about 0.5 inches. In some embodiments, the major lateral dimension of each of the outer channels may be more or less than 0.5 inches in diameter depending on, for example, the size of the showerhead plate. The major lateral dimension of the inner channel with respect to the outer channel may be adjusted based on the amount of inner channels and outer channels and the amount of flushing that is desired for the inner apertures and the exhaust holes of the showerhead (described in more detail in connection with FIG. 3). In one specific implementation, there can be four (4) inner channels, each with a 1.5 inch diameter, and two (2) outer channels, each with 0.5 inch diameter.

In some embodiments, the inner cavity 206 may comprise a cylindrical cavity (e.g., with an elliptical or circular profile as seen from a bottom plan view). The outer cavity 204 may include an annular shape (e.g., a circular shape or an elliptical racetrack shape) which surrounds the inner cavity. In some embodiments the inner cavity 206 may be divided into separate cavities which connect to separate inner apertures of a showerhead. Further, the outer cavity may be divided into separate cavities which connect to separate exhaust holes. In some embodiments, the flush fixture 202 may be made out of a material softer than the material of the showerhead. For example, when the showerhead is made out of a metal, the flush fixture body 200 may be made out of a polymer or plastic such as polypropylene. In other embodiments, the fixture body 200 can comprise a metal. A softer material may allow the flush fixture 202 to avoid damaging the showerhead when mounted.

Figure 3:
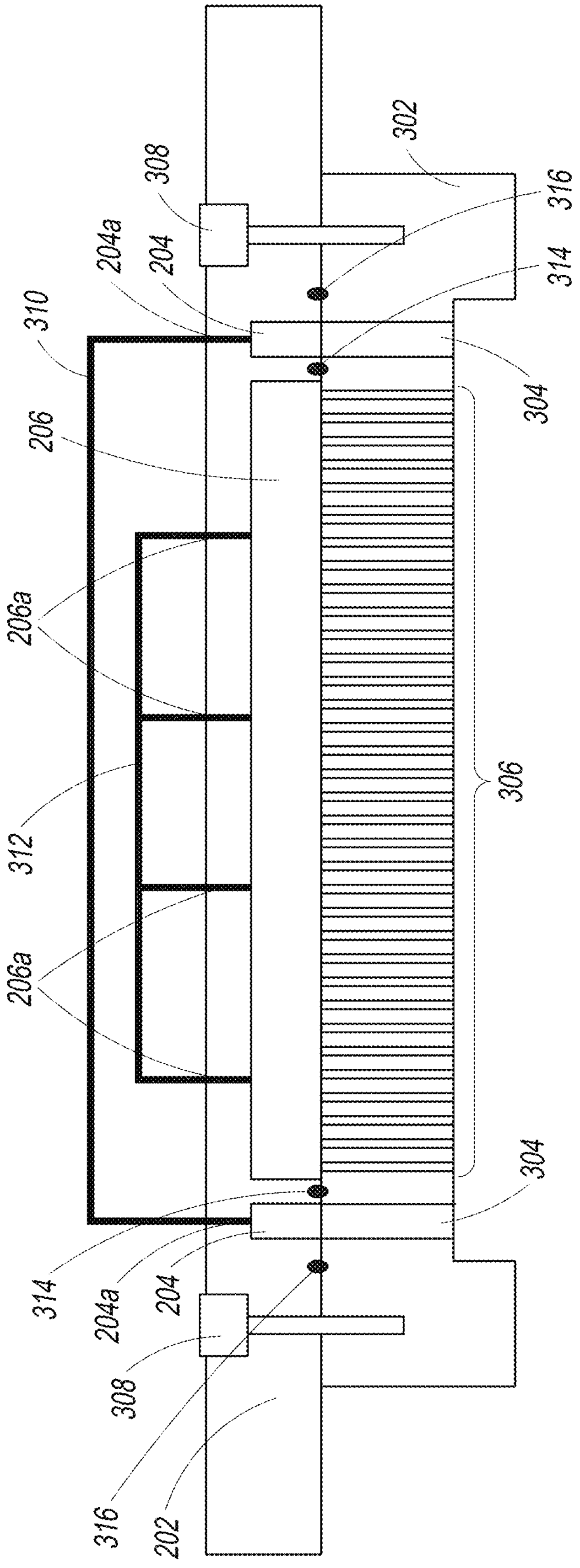
FIG. 3 is a schematic cross sectional view of an embodiment of a system for flushing a showerhead plate.

FIG. **2*b* illustrates a top down view of the flush fixture 202 of FIG. 2*a*. FIG. 2*b* shares reference numbers with FIG. 2*a* and description of the shared reference numbers is applicable for FIG. 2*b*. The inner cavity 206 and the outer cavity 204 are divided as illustrated by dashed lines in FIG. 2*b* for case of illustration. As illustrated, the inner channels 206*a* and the outer channels 204*a* may have a rounded (e.g., a circular) cross sectional shape. The flush fixture 202 also may include holes 208 where first connectors or screws may be placed to secure the flush fixture 202 to the showerhead plate. The first connectors or screws may be capable of securing the showerhead to the flush fixture 202. The flush fixture also may include holes 210 which may be used for adjustably fixing a showerhead to the flush fixture 202 by second connectors or screws, such as fasteners 308 (as shown in FIG. 3). In some embodiments, the fasteners 308 can comprise jacking screws insertable into the holes 208 and configured to adjust a separation between the flush fixture 202 and the showerhead plate. The flush fixture of FIG. 2*a* or 2*b* may be connected to a showerhead plate of a showerhead assembly as shown in FIG. 3. In some embodiments, the flush fixture 202** can be connected to a multi-plate showerhead assembly.

FIG. 3 illustrates the flush fixture 202 of FIGS. **2*a* and 2*b* mounted to a showerhead plate 302 of a showerhead assembly. Details of the flush fixture 202 are described in connection with FIG. 2*a* or 2*b* and are not repeated. The one or more inner channels 206*a* are connected to an inner delivery piping 312 which is configured to deliver flushing fluid into the one or more inner channels 206*a*. The one or more outer channels 204*a* are connected to an outer delivery piping 310 which is connected to deliver flushing fluid into the one or more outer channels 206*a*. The inner delivery piping 312 and the outer delivery piping 310 may be both connected to the same flushing fluid source or separate flushing fluid sources. The same type of flushing fluid or different types of flushing fluids may be delivered to the inner or outer cavities 206, 204. In FIG. 3, the inner delivery piping 312 and the outer delivery piping 310 is shown schematically for case of illustration. Beneficially, the flushing fluid(s) can be independently delivered through the inner delivery piping 312 to the inner channels 206*a* and through the outer delivery piping 310 to the outer channels 204*a***.

The showerhead plate 302 includes both inner apertures 306 and exhaust holes 304. The exhaust holes 304 are positioned to surround the inner apertures 306 and are located radially outward from the inner apertures 306 with respect to the center of the showerhead 302. The inner apertures 306 may be substantially cylindrical holes or they may have flared inputs and/or outputs. The inner apertures 306 may have any suitable profile. Similarly, the outer exhaust holes 304 may be substantially cylindrical holes or they may have flared inputs and/or outputs. The outer exhaust holes 304 may have any suitable profile. Each of the inner apertures 306 are substantially smaller than each of the exhaust holes 304. For example, when the inner aperture 306 and exhaust holes 304 are substantially cylindrical holes, the diameter of the exhaust holes 304 is larger than the diameter of the inner apertures 306. Further, when the inner apertures 306 have a flared input and/or output and the exhaust holes 304 have a flared input and/or output, each of the inner apertures 306 and each of the exhaust holes 304 may include a cylindrical middle portion. The cylindrical middle portion of the exhaust holes 304 can be larger than the cylindrical middle portion of the inner apertures 306. When the showerhead plate 302 and showerhead assembly are used in a semiconductor processing device, gas (e.g., reactant and/or inactive gases) can be delivered to the reactor through the inner apertures 306. The gases can be removed or exhausted from the reaction chamber through the exhaust holes 304.

The flush fixture 202 can be mounted to the showerhead plate 302 such that the inner apertures 306 are in fluid communication with the inner cavity 206 and the exhaust holes 304 are in fluid communication with the outer cavity 204. As illustrated, the flush fixture 202 can be mounted to the showerhead 302 by one or more connectors 308 (e.g., one or more screws, bolts, or other suitable fastener). In some embodiments, the connectors 308 can comprise jacking screws insertable into holes 208. The flush fixture 202 may be mounted to the showerhead plate 302 by other fasteners such as a clamp. By providing separate access to the inner apertures 306 and the exhaust holes 304, the inner cavity 206 may provide independent flushing fluid to the inner apertures 306 from the flushing fluid provided to the exhaust holes 304 by the outer cavity 204. Thus, the larger size of the exhaust holes 304 will not affect the amount of flushing fluid that goes through the inner apertures 306, which allows both the inner apertures 306 and the exhaust holes 304 to be properly flushed.

An inner gasket 314 can be positioned between the flush fixture 202 and the showerhead 302 and surrounds the inner cavity 206 in a direction parallel to the extending direction of the flush fixture. When the flush fixture 202 is mounted to the showerhead 302, the inner gasket 314 keeps the flushing fluid delivered into the inner cavity from entering the outer cavity and the one or more exhaust holes. Further, the inner gasket keeps the flushing fluid delivered into the outer cavity from entering the inner cavity and the inner apertures. An outer gasket 316 can also be positioned between the flush fixture 202 and the showerhead 302 and surrounds the outer cavity 204 in a direction parallel to the extending direction of the flush fixture. When the flush fixture 202 is mounted to the showerhead 302, the outer gasket 316 seals the flushing fluid from exiting the showerhead 302 and flush fixture 202.

Figure 4:
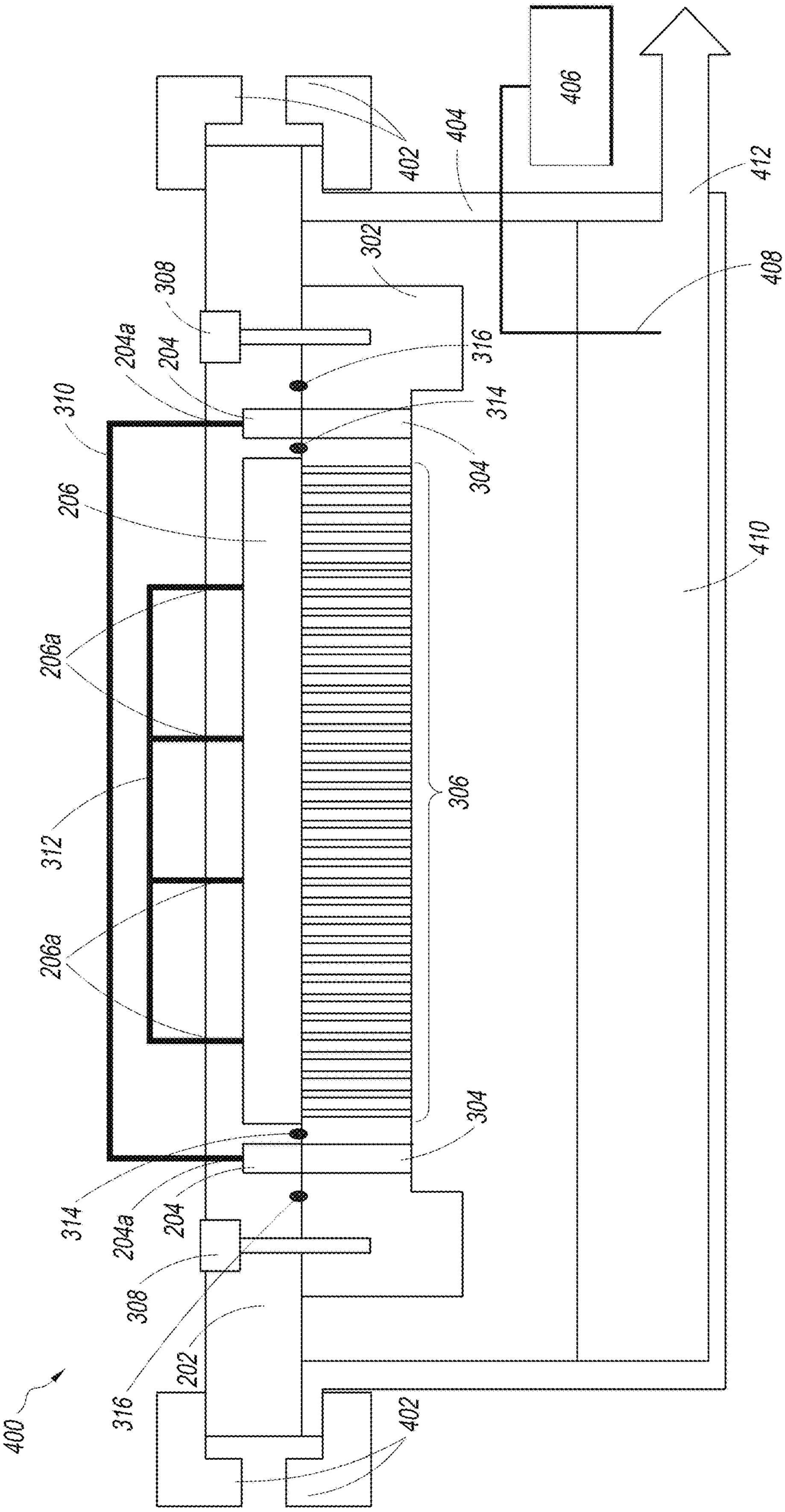
FIG. 4 illustrates a cross sectional view of an embodiment of a system for flushing a showerhead plate.

FIG. 4 illustrates a system 400 for flushing a showerhead plate or assembly. The system 400 includes the flush fixture 202 mounted on the showerhead plate 302 of FIG. 3. The features of FIG. 3 are not repeated here. A reservoir 404 is positioned below the flush fixture 202 mounted on the showerhead 206. The reservoir 404 may be secured to the flush fixture 202 or showerhead plate 302 by one or more clamps 402. The reservoir 404 may also be secured to the flush fixture 202 or showerhead plate 302 through a screw or a bolt or the flush fixture 202 mounted to the showerhead plate 302 may be placed above the reservoir 404 unsecured. The reservoir 404 includes a sensor 406 which is connected to a probe 408. The sensor 406 may be outside the reservoir 404 while the probe 408 may be within the reservoir 404. Alternatively, the sensor 406 may be located within the reservoir 404 and can transmit measurements wirelessly. While flushing fluid is flowed through the flush fixture 202 and the showerhead plate 302, the flushing fluid 410 collects at the bottom of the reservoir 404. The reservoir 404 includes a drain 412 which may be used to drain flushing fluid 410 after it has flushed through the showerhead 302.

While flushing fluid is run through the showerhead plate 302, the flushing fluid removes particles and/or debris from the showerhead plate 302 (e.g., from the inner apertures 306 and exhaust holes 304). The combination of flushing fluid and particles and/or debris have a different property than the flushing fluid itself. Thus, by measuring properties of the flushing fluid 410 after it has flushed through the showerhead plate 302, the amount of particles and/or debris being removed from the showerhead plate 302 can be monitored. The sensor 406, by way of the probe 408, may monitor one or more properties of the flushing fluid 410 collected within the reservoir 404 to determine the amount of particles and/or debris being removed from the showerhead plate 302. The one or more properties may be one or more electrical properties such as resistivity, conductivity, inductance, capacitance, or magnetism. For example, when the particles and/or debris are metallic, the resistivity of flushing fluid 410 including particles and/or debris may be lower than the resistivity of the flushing fluid 410 without particles and/or debris. The sensor 406 may be configured to monitor resistivity of the flushing fluid 410 through the probe 408. When the flushing fluid first begins flushing particles and/or debris out of the showerhead 302, the resistivity of the flushing fluid 410 may be relatively low because of a large amount of particles and/or debris within the flushing fluid 410. As the particles and/or debris are flushed out of the showerhead 302, the resistivity of the flushing fluid 410 may increase because the flushing fluid exiting the showerhead plate 302 would include comparatively less particles and/or debris. When this measured resistivity substantially levels off or substantially ceases to increase, the flushing may cease because there is not particles and/or debris exiting the showerhead 302.

Figure 5:
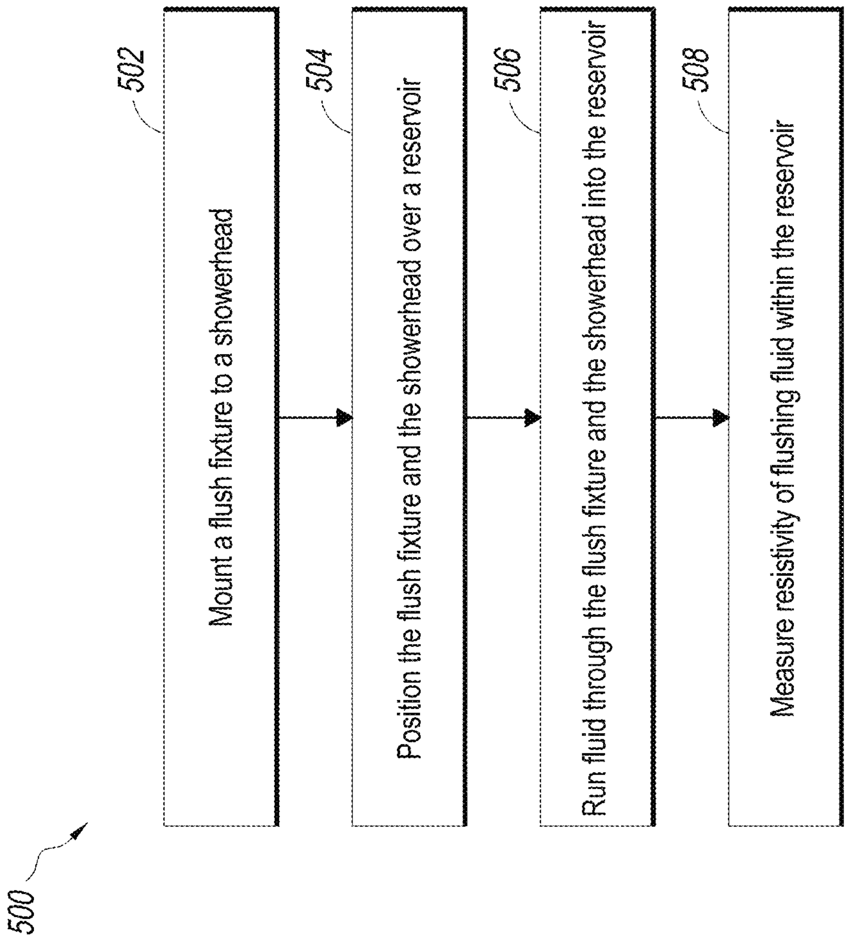
FIG. 5 is a flowchart of an example method for flushing a showerhead plate.

FIG. 5 illustrates a flowchart of an exemplary method 500 for flushing a showerhead plate or assembly. The method may use the components of the system 400 for flushing a showerhead plate or assembly described in FIG. 4. In block 502, a flush fixture is mounted to a showerhead plate. The flush fixture may comprise the flush fixture 202 and showerhead plate 302 described above in FIGS. 2-4. In block 504, the flush fixture and the showerhead plate are positioned over a reservoir. The reservoir may comprise the reservoir 402 described in connection with FIG. 4. The reservoir 402 may include a sensor 406 which is connected to a probe 408.

In block 506, flushing fluid is delivered through the flush fixture and the showerhead into the reservoir 402. As explained above, the flushing fluid can be delivered from a common source or two separate sources. The flushing fluid can be delivered to the inner cavity 206 by way of the one or more inner channels 206*a*. The flushing fluid can concurrently be delivered to the outer cavity 204 by way of the one or more outer channels 204*a*. The fluid from the inner cavity 206 can be driven through the inner apertures 306 of the showerhead plate 302. The fluid from the outer cavity 204 can be driven through the outer exhaust holes 304. Because the inner and outer cavities 206, 204 may be substantially sealed from one another, the pressure of the flushing fluids within the cavities 206, 204 may be independently controlled such that an adequate flow of fluid may be driven respectively through the inner apertures 306 and the exhaust holes 304. Beneficially, as explained above, independently flushing the inner apertures 306 and the outer exhaust holes 304 using the fixture 202 can ensure that the inner aperture 306 and the exhaust holes 304 are cleaned in a thorough and efficient manner.

As illustrated in FIG. 4, the flushing fluid 410 is collected in the reservoir 402 and exists through a drain 412. In block 508, the resistivity of the flushing fluid collected within the reservoir 402 is measured. The sensor 406 may be configured through the probe to sense resistivity of the flushing fluid 410. When the particles and/or debris are metallic, as the flushing fluid first begins flushing particles and/or debris out of the showerhead 302, the resistivity of the flushing fluid 410 would be low. However, as less particles and/or debris exit the showerhead 302, the resistivity of the flushing fluid 410 will be higher. Thus, when the resistivity of the flushing fluid 410 substantially levels off or substantially ceases to increase, the flushing may cease because substantially no particles and/or debris are exiting the showerhead 302.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. A flush fixture for flushing component(s) of a showerhead assembly of a semiconductor processing device, the flush fixture comprising:
- a fixture body configured to be coupled to the component(s) of the showerhead assembly, the fixture body having an upper surface defined by an upper surface outer edge, a lower surface defined by a lower surface outer edge, wherein the lower surface is opposite the upper surface, and an outer side surface connecting and spanning between the upper surface outer edge and the lower surface outer edge, the fixture body comprising:
  - an inner cavity exposed at the lower surface of the fixture body;
  - an outer cavity exposed at the lower surface of the fixture body and separated from the inner cavity by a partition, wherein the outer cavity comprises an annular cavity spanning about the inner cavity and at least partially surrounding the inner cavity;

one or more inner channels in fluid communication with the inner cavity, the one or more inner channels extending from the inner cavity to the upper surface; and one or more outer channels in fluid communication with the outer cavity, the one or more outer channels extending from the outer cavity to the upper surface.

2. The flush fixture of claim 1, wherein the fixture body comprises a polymer material.

3. A system for flushing a showerhead assembly comprising:

the flush fixture of claim 1; and inner delivery piping coupled to the upper surface of the fixture body and in fluid communication with the one or more inner channels, the inner delivery piping configured to deliver flushing fluid into the one or more inner channels.

4. The system of claim 3, further comprising outer delivery piping coupled to the upper surface of the fixture body and in fluid communication with the one or more outer channels, the outer delivery piping configured to deliver flushing fluid into the one or more outer channels.

5. The system of claim 4, wherein the inner delivery piping and the outer delivery piping are both connected to the same flushing fluid source, the inner delivery piping and the outer delivery piping being configured to independently deliver the flushing fluid into the respective one or more inner channels and one or more outer channels.

6. The system of claim 4, wherein the inner delivery piping and the outer delivery piping are connected to separate flushing fluid sources.

7. The system of claim 3, further comprising a showerhead plate comprising inner apertures and one or more exhaust holes, wherein the flush fixture is coupled to the showerhead plate, upstream from the showerhead plate, such that the inner apertures are in fluid communication only with the inner cavity of the flush fixture and the one or more exhaust holes are in fluid communication only with the outer cavity of the flush fixture.

8. The system of claim 7, wherein the showerhead plate comprises a metal or a metal alloy.

9. The system of claim 7, further comprising an inner gasket positioned between the showerhead plate and the flush fixture, the inner gasket horizontally surrounding the inner cavity in order to prevent the flushing fluid delivered into the inner cavity from entering the outer cavity and the one or more exhaust holes, and in order to prevent the flushing fluid delivered into the outer cavity from entering the inner cavity and the inner apertures.

10. The system of claim 9, further comprising an outer gasket positioned between the showerhead plate and the flush fixture, the outer gasket surrounding the outer cavity in order to direct the flushing fluid delivered into the outer cavity into the one or more exhaust holes.

11. The system of claim 7, wherein the one or more exhaust holes are positioned to surround the inner apertures.

12. The system of claim 11, wherein the one or more exhaust holes are located radially outwards from the inner apertures with respect to the center of the flush fixture.

13. The system of claim 7, wherein the one or more exhaust holes is larger in diameter than at least one of the inner apertures.

14. The system of claim 7, wherein the one or more exhaust holes and the inner apertures include a cylindrical middle portion and wherein the diameter of the cylindrical middle portion of each exhaust hole is larger than the cylindrical middle portion of each inner aperture.

15. The system of claim 7, wherein the flush fixture is coupled to the showerhead plate by a connector.

16. The system of claim 7, further comprising:

a reservoir comprising:

a drain;

a sensor; and a probe connected to the sensor, wherein the flush fixture and showerhead plate are configured to be coupled to the reservoir such that when the flushing fluid is flushed through the showerhead plate, the fluid drains into the reservoir and an electrical property is sensed by the sensor through the probe.

17. A flush fixture for flushing a showerhead plate of a semiconductor processing device, the flush fixture comprising:

a fixture body configured to be coupled to the showerhead plate, the fixture body having an upper surface defined by an upper surface outer edge, a lower surface defined by a lower surface outer edge, wherein the lower surface is opposite the upper surface, and an outer side surface connecting and spanning between the upper surface outer edge and the lower surface outer edge, the fixture body comprising:

an inner cavity exposed at the lower surface of the fixture body;

an outer cavity exposed at the lower surface of the fixture body and separated from the inner cavity by a partition, the outer cavity comprising an annular cavity spanning about the inner cavity and at least partially surrounding the inner cavity; and one or more outer channels in fluid communication with the outer cavity, the one or more outer channels extending from the outer cavity to the upper surface.

18. The flush fixture of claim 17, wherein the fixture body further comprises:

one or more inner channels in fluid communication with the inner cavity, the one or more inner channels extending from the inner cavity to the upper surface, wherein the upper surface is planar.

19. A method of flushing a component(s) of a showerhead assembly, the method comprising:

mounting the flush fixture of claim 17 to the showerhead plate such that the inner cavity of the flush fixture is in fluid communication with a plurality of inner apertures of the showerhead plate and such that the outer cavity of the flush fixture is in fluid communication with one or more exhaust holes of the showerhead plate;

delivering one or more flushing fluids through the inner cavity and the inner apertures; and delivering the one or more flushing fluids through the outer cavity and the one or more exhaust holes.

20. The method of claim 19, further comprising:

positioning the flush fixture and the showerhead plate over a reservoir, wherein the reservoir includes a resistivity sensor; and measuring the resistivity of the flushing fluid captured within the reservoir with the resistivity sensor, wherein running flushing fluid through the flush fixture and the showerhead plate occurs until the measured resistivity stabilizes.

21. The method of claim 19, wherein the one or more flushing fluids are independently delivered through the inner cavity and the outer cavity.

* * * * *